(12) United States Patent
Dehe et al.

(10) Patent No.: US 9,591,408 B2
(45) Date of Patent: Mar. 7, 2017

(54) ADJUSTABLE VENTILATION OPENINGS IN MEMS STRUCTURES

(71) Applicant: Infineon Technologies AG, Neubiberg (DE)

(72) Inventors: Alfons Dehe, Reutlingen (DE); Martin Wurzer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 14/553,718

(22) Filed: Nov. 25, 2014

(65) Prior Publication Data

US 2015/0078587 A1    Mar. 19, 2015

Related U.S. Application Data

(63) Continuation of application No. 13/408,971, filed on Feb. 29, 2012, now Pat. No. 8,983,097.

(51) Int. Cl.

| | | |
|---|---|---|
| *H04R 19/04* | (2006.01) | |
| *H04R 1/22* | (2006.01) | |
| *H04R 7/26* | (2006.01) | |
| *B81B 3/00* | (2006.01) | |
| *H04R 19/00* | (2006.01) | |

(52) U.S. Cl.
CPC ........... *H04R 19/04* (2013.01); *B81B 3/0078* (2013.01); *H04R 1/222* (2013.01); *H04R 7/26* (2013.01); *B81B 2201/0257* (2013.01); *B81B 2203/0127* (2013.01); *H04R 19/005* (2013.01); *H04R 2201/003* (2013.01)

(58) Field of Classification Search
CPC ...... H04R 19/00; H04R 19/04; H04R 19/005; H04R 2410/07; B81B 3/0035; B81B 3/0054; B81B 3/0056; B81B 3/0059; B81B 2201/0257
See application file for complete search history.

(56) References Cited

U.S. PATENT DOCUMENTS

| | | | |
|---|---|---|---|
| 5,146,435 A | 9/1992 | Bernstein | |
| 5,452,268 A * | 9/1995 | Bernstein ............. | H04R 19/005 367/181 |
| 6,075,867 A | 6/2000 | Bay et al. | |
| 6,160,896 A | 12/2000 | Macaluso et al. | |
| 6,549,635 B1 | 4/2003 | Gebert | |
| 6,590,267 B1 * | 7/2003 | Goodwin-Johansson | B81B 3/0021 257/414 |

(Continued)

FOREIGN PATENT DOCUMENTS

| | | |
|---|---|---|
| CN | 1589587 A | 3/2005 |
| JP | 200432019 A | 1/2004 |

(Continued)

*Primary Examiner* — Matthew Eason
(74) *Attorney, Agent, or Firm* — Slater Matsil, LLP

(57) ABSTRACT

A MEMS structure and a method for operation a MEMS structure are disclosed. In accordance with an embodiment of the present invention, a MEMS structure comprises a substrate, a backplate, and a membrane comprising a first region and a second region, wherein the first region is configured to sense a signal and the second region is configured to adjust a threshold frequency from a first value to a second value, and wherein the backplate and the membrane are mechanically connected to the substrate.

13 Claims, 10 Drawing Sheets

(56) References Cited

U.S. PATENT DOCUMENTS

| | | | |
|---|---|---|---|
| 7,023,066 B2 | 4/2006 | Lee et al. | |
| 7,233,679 B2* | 6/2007 | Muthuswamy | H04R 19/04 381/174 |
| 7,253,016 B2* | 8/2007 | Barzen | H04R 19/005 257/415 |
| 7,570,772 B2* | 8/2009 | Sorensen | H04R 1/34 381/170 |
| 7,912,236 B2* | 3/2011 | Dehe | H04R 19/005 29/594 |
| 8,447,054 B2* | 5/2013 | Bharatan | H04R 1/28 381/174 |
| 2004/0259286 A1 | 12/2004 | Dehe et al. | |
| 2005/0179100 A1 | 8/2005 | Barzen et al. | |
| 2005/0185812 A1 | 8/2005 | Minervini | |
| 2005/0207605 A1 | 9/2005 | Dehe et al. | |
| 2005/0241944 A1 | 11/2005 | Dehe et al. | |
| 2005/0262947 A1 | 12/2005 | Dehe | |
| 2006/0291674 A1* | 12/2006 | Gong | H04R 19/04 381/174 |
| 2007/0034976 A1 | 2/2007 | Barzen et al. | |
| 2007/0201710 A1* | 8/2007 | Suzuki | B81B 3/0072 381/174 |
| 2008/0104825 A1 | 5/2008 | Dehe et al. | |
| 2008/0218934 A1 | 9/2008 | Langereis et al. | |
| 2008/0247573 A1* | 10/2008 | Pedersen | H04R 19/005 381/174 |
| 2008/0304681 A1 | 12/2008 | Langlois et al. | |
| 2009/0162534 A1 | 6/2009 | Dehe et al. | |
| 2009/0309174 A1 | 12/2009 | Fueldner et al. | |
| 2010/0158281 A1 | 6/2010 | Lee et al. | |
| 2010/0164025 A1 | 7/2010 | Yang | |
| 2010/0175477 A1 | 7/2010 | Kasai et al. | |
| 2011/0110550 A1 | 5/2011 | Bharatan et al. | |
| 2011/0123043 A1* | 5/2011 | Felberer | H04R 19/005 381/94.2 |
| 2011/0127623 A1 | 6/2011 | Fueldner et al. | |
| 2011/0144415 A1 | 6/2011 | Hellmuth et al. | |
| 2011/0156176 A1 | 6/2011 | Huckabee et al. | |
| 2011/0170735 A1 | 7/2011 | Dehe et al. | |
| 2011/0272769 A1 | 11/2011 | Song et al. | |
| 2011/0311081 A1* | 12/2011 | Kim | B81B 7/0016 381/174 |
| 2012/0033831 A1* | 2/2012 | Leitner | H04R 1/083 381/98 |
| 2012/0250909 A1* | 10/2012 | Grosh | H04R 7/06 381/174 |
| 2013/0129119 A1 | 5/2013 | Miyatake et al. | |
| 2013/0223023 A1* | 8/2013 | Dehe | B81B 7/0029 361/752 |
| 2013/0223654 A1 | 8/2013 | Dehe et al. | |
| 2014/0084396 A1* | 3/2014 | Jenkins | B81B 3/0021 257/419 |
| 2014/0161290 A1* | 6/2014 | Jenkins | B81B 3/0021 381/174 |
| 2015/0175404 A1* | 6/2015 | Jenkins | B81B 3/0021 257/415 |
| 2016/0080871 A1* | 3/2016 | Zinn | H04R 19/04 381/369 |
| 2016/0083246 A1* | 3/2016 | Jenkins | B81B 3/0021 257/415 |

FOREIGN PATENT DOCUMENTS

| | | |
|---|---|---|
| JP | 2007321986 A | 12/2007 |
| JP | 201239272 A | 2/2012 |
| KR | 1020100006164 A | 1/2010 |

* cited by examiner

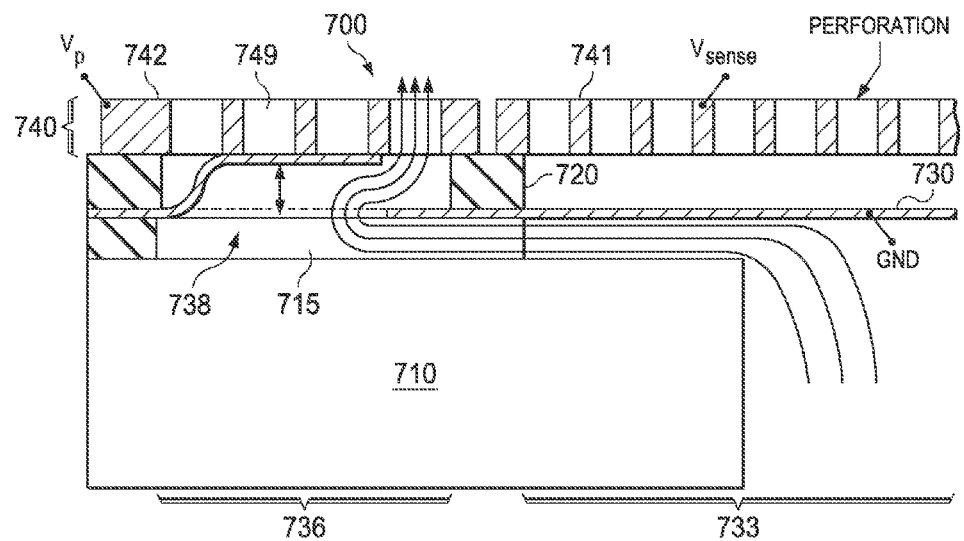
FIG. 7b
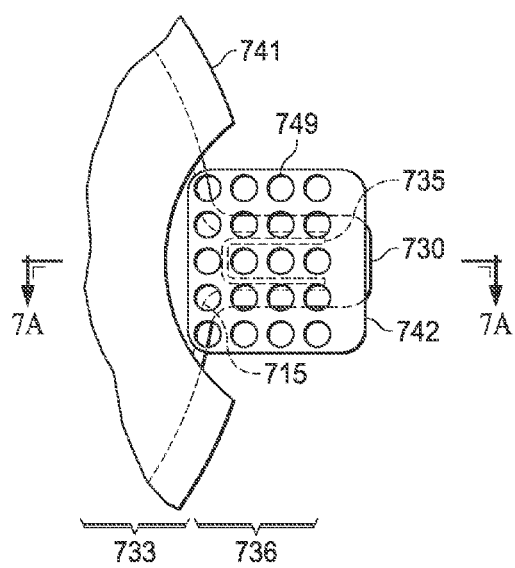

ADJUSTABLE VENTILATION OPENINGS IN MEMS STRUCTURES

This is a continuation application of U.S. application Ser. No. 13/408,971, entitled "Adjustable Ventilation Openings in MEMS Structures" which was filed on Feb. 29, 2012 and is incorporated herein by reference.

TECHNICAL FIELD

The present invention relates generally to an adjustable ventilation opening in a MEMS structure and a method for operating a MEMS structure.

BACKGROUND

In general, microphones are manufactured in large numbers at low cost. Due to these requirements, microphones are often produced in silicon technology. Microphones are produced with different configurations for their different field of applications. In one example, microphones measure the change in capacity by measuring the deformation or deflection of the membrane relative to a counter electrode. The microphone is typically operated a setting a bias voltage to an appropriate value.

A microphone may have operation and other parameters such as signal-to-noise ratio (SNR), rigidity of the membrane or counter electrode, or diameter of the membrane which often are set by the manufacturing process. In addition, a microphone may have different characteristics based on different materials used in the manufacturing process.

SUMMARY OF THE INVENTION

In accordance with an embodiment of the present invention, a MEMS structure comprises a substrate, a backplate, and a membrane comprising a first region and a second region, wherein the first region is configured to sense a signal and the second region is configured to adjust a threshold frequency from a first value to a second value, and wherein the backplate and the membrane are mechanically connected to the substrate.

In accordance with another embodiment of the present invention, a MEMS structure comprises a substrate, a backplate, and a membrane comprising an adjustable ventilation opening. The backplate and the membrane are mechanically connected to the substrate.

In accordance with an embodiment of the present invention, a method for operating a MEMS structure comprises sensing an acoustic signal by moving a sensing region of a membrane relative to a backplate and opening or closing an adjustable ventilation opening in the membrane if a high energy signal is detected.

In accordance with an embodiment of the present invention, a method comprises sensing an acoustic signal by moving a membrane relative to a backplate, and opening or closing an adjustable ventilation opening in the membrane if an application setting of the MEMS structure is changed.

BRIEF DESCRIPTION OF THE DRAWINGS

For a more complete understanding of the present invention, and the advantages thereof, reference is now made to the following descriptions taken in conjunction with the accompanying drawings, in which:

FIG. 5b shows a top-view of an embodiment of the MEMS structure of FIG. 5a;
FIG. 7b shows a cross-section view of an embodiment of an actuated MEMS structure;
FIG. 7c shows a top-view of an embodiment of the MEMS structure of FIG. 7a.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely sensors or microphones. The invention may also be applied, however, to other MEMS structures such as pressure sensors, RF MEMS, accelerometers, and actuators.

Microphones are realized as parallel plate capacitor on a chip. The chip is packaged enclosing a given back-volume. A movable membrane vibrates due to pressure differences such as acoustic signals. The membrane displacement is translated into an electrical signal using capacitive sensing.

Figure 1A:
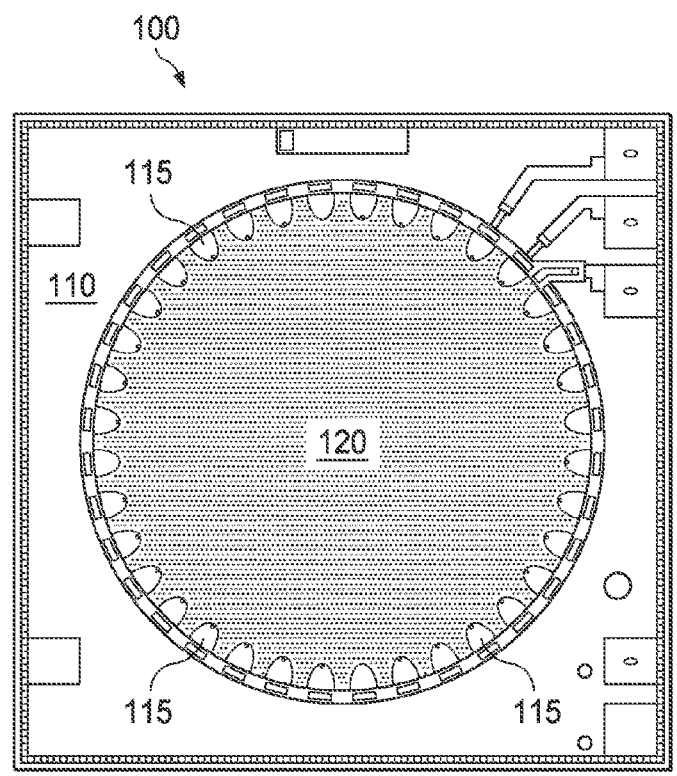
FIG. 1a shows a top view of a MEMS structure.
Figure 1B:
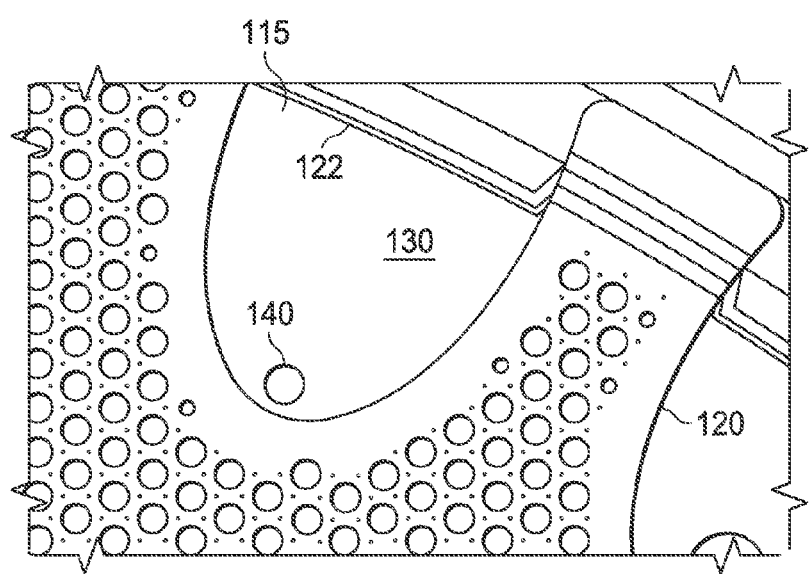
FIG. 1b shows a detailed perspective view of a connection region of a MEMS structure.
Figure 1C:
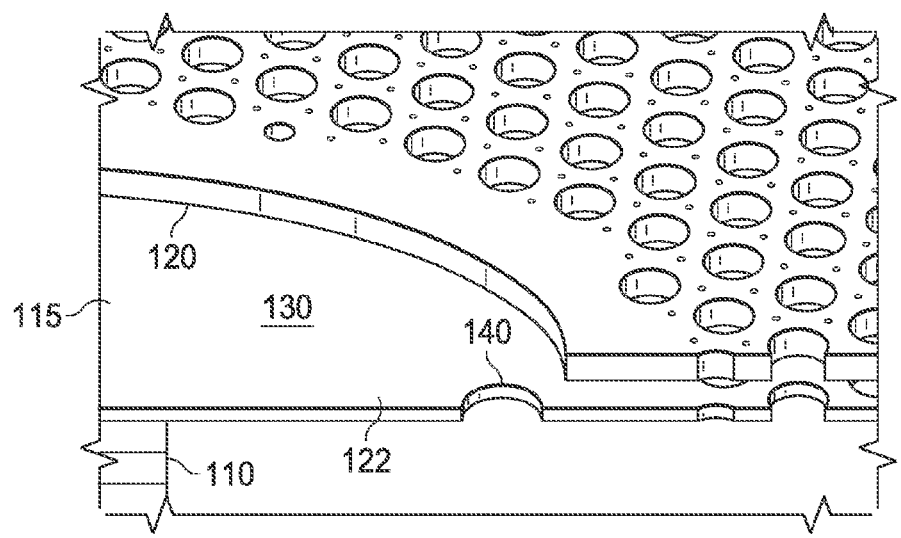
FIG. 1c shows a cross sectional view of a connection region of a MEMS structure.

FIG. 1a shows a top view of a MEMS device 100. A backplate or counter electrode 120 and a movable electrode or membrane 130 are connected via connection regions 115 to the substrate 110. FIGS. 1b and 1c show detailed perspective views of one connection regions 115 of the MEMS device 100. A backplate or counter electrode 120 is arranged over a membrane or movable electrode 130. The backplate 120 is perforated to avoid or mitigate damping. The membrane 130 comprises a ventilation hole 140 for low frequency pressure equalization.

In the embodiment of FIGS. 1a-1c the membrane 130 is mechanically connected to the substrate 110 in the connection regions 115. In these regions 115 the membrane 130 cannot move. The backplate 120 is also mechanically connected to the substrate 110 in the connection region 115. The substrate 110 forms a rim 122 to provide space for the back-volume. The membrane 130 and the backplate 120 are connected to the substrate at or close to the rim 122. In this embodiment the rim 122 and the membrane 120 form a circle. Alternatively, the rim 122 and the membrane 120 may comprise a square or may comprise any other suitable geometrical form.

In general, designing and manufacturing a sensor requires a high signal-to-noise ratio (SNR). Among other things, this can be achieved when the change in capacitances to be measured is as great as possible and when the parasitic capacitances are as small as possible. The greater the parasitic portion of the capacitance is relative to the overall capacitance, the smaller the SNR.

The compliance of the back-volume and the resistance of the ventilation path through the ventilation hole define the RC constant of the sensor. If the ventilation hole is large the corner frequency is a relatively high frequency and if the ventilation hole is small the corner frequency is a relatively lower frequency. Both back-volume and the diameter of the ventilation hole are given by construction and hence the corner frequency is given by construction. Accordingly, the corner frequency cannot be changed during operation.

A problem with a fixed size ventilation hole is that high energetic signals that have a frequency higher than the corner frequency of the ventilation hole distort or overdrive the sensor even with the application of electrical filters. Moreover, if a sensor is used for more than one application two sensors must be integrated into one sensor system which doubles the system costs.

An embodiment of the invention provides tunable ventilation openings in a MEMS structure. The tunable ventilation openings may be switched between an open position and a closed position. The tunable ventilation holes may also be set in an intermediate position. Another embodiment of the invention provides a variable ventilation opening cross-section. An embodiment of the invention provides a tunable ventilation opening in a sensing region close to a rim of the substrate. A further embodiment provides a tunable ventilation opening in a tuning region outside the sensing region of the membrane.

Figure 2A:
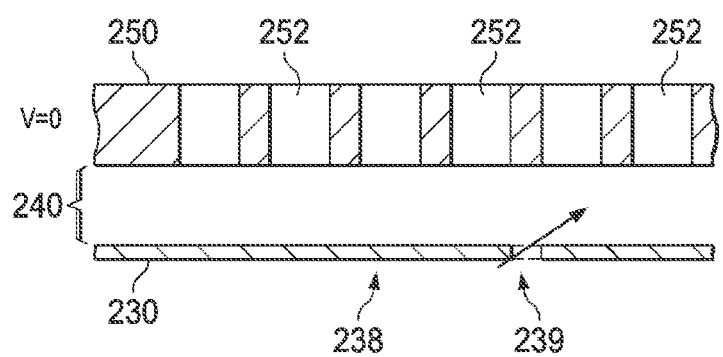
FIGS. 2a-2c show cross-sectional views of an embodiment of an adjustable ventilation opening.
Figure 2B:
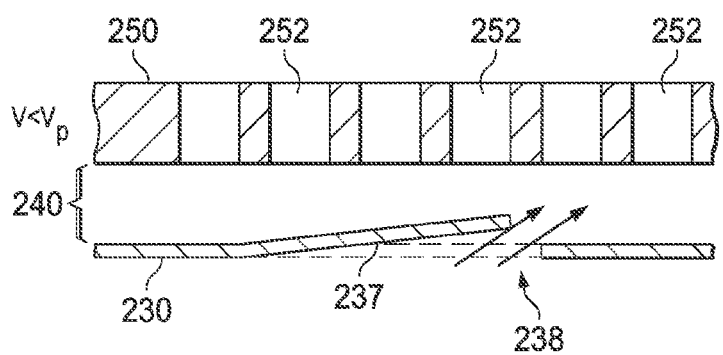
Figure 2C:
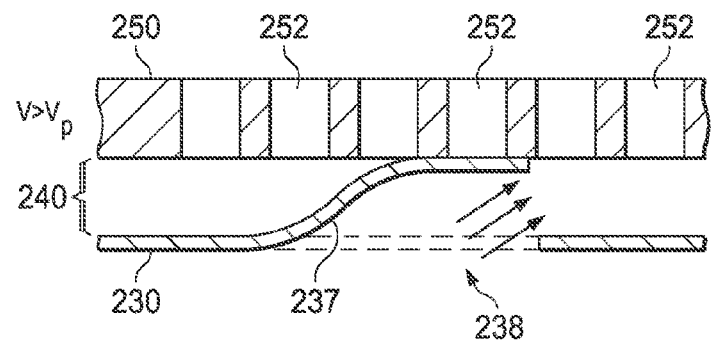
Figure 2D:
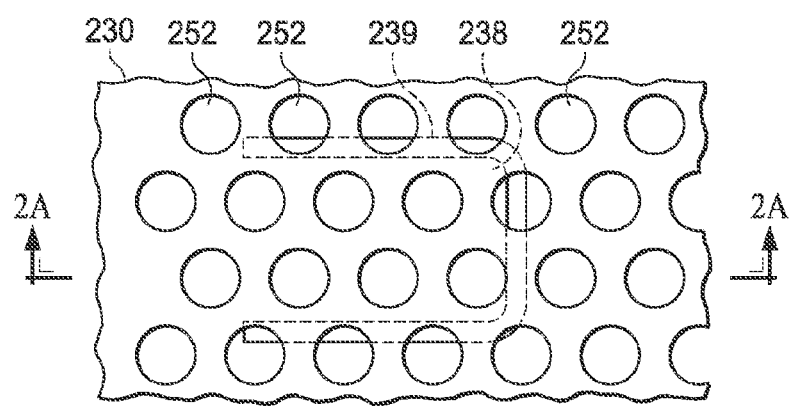
FIG. 2d shows a top view of an embodiment of an adjustable ventilation opening.

FIGS. 2a-2c show a cross sectional views of a backplate or counter-electrode 250 and a membrane or movable electrode 230 having an air gap 240 between them. The backplate 250 is perforated 252 and the membrane 230 comprises an adjustable ventilation opening 238. FIG. 2d shows a top view of this arrangement with the circles indicating the perforated back plate 250, 252 and dark plane being the underlying membrane 230. In this embodiment the movable portion 237 of the adjustable ventilation hole 238 is formed as a U shaped slot 239. The adjustable ventilation opening 238 may comprise of rectangular, square or semicircle form. Alternatively, the adjustable ventilation opening 238 may comprise any geometrical form as long as the form is able to provide a ventilation path. The movable portion 237 of the adjustable ventilation opening 238 may be a cantilever, a bridge or a spring supported structure.

The FIG. 2a shows a configuration where the actuation voltage (bias voltage) $V_{bias}$=0. The adjustable ventilation opening 238 is closed forming a small slot 239 in the membrane 230. No actuation voltage provides a minimal ventilation path and therefore a low threshold frequency. The adjustable ventilation opening 238 is in a closed or OFF (non-activated) position. An example of such a low threshold frequency can be seen as frequency "A" in FIG. 2e.

FIG. 2b shows a configuration where the actuation voltage $V_{bias}$ is increased, i.e. is different than 0 V but lower than the pull-in voltage $V_{pull-in}$. The adjustable ventilation opening 238 opens and provides a larger ventilation path than in the configuration of FIG. 2a. The threshold frequency can be seen as frequency "B" in FIG. 2e. It is noted that adjustable ventilation opening 238 may provide a sizable ventilation path when displacement of the movable portion 237 is larger than the thickness of the membrane 230.

FIG. 2c shows a configuration where the actuation voltage $V_{bias}$ is larger than pull-in voltage $V_{pull-in}$. The adjustable ventilation opening 238 is completely open and a large ventilation path is created. The threshold frequency can be seen as frequency "C" in FIG. 2e. By adjusting the actuation voltage the RC constant can be decreased or increased and the threshold frequency can be set according to a desired value. It is noted that the adjustable ventilation opening may already open completely for actuation voltages below the pull-in voltage.

Figure 2E:
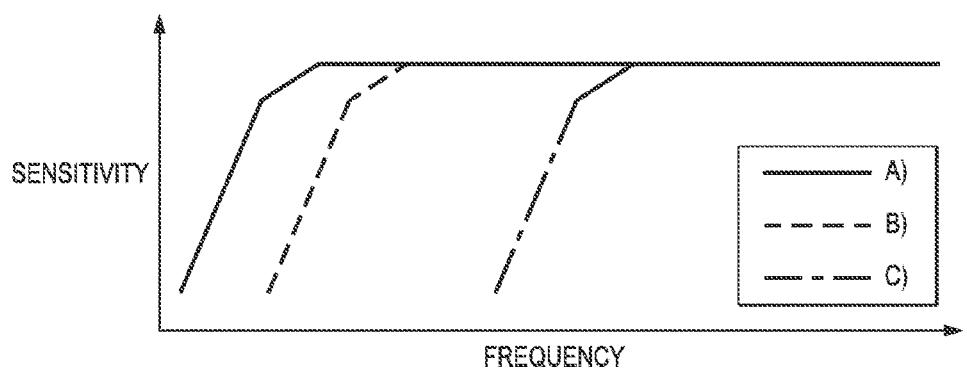
FIG. 2e shows a diagram for a corner or threshold frequency.

Referring now to FIG. 2e, in one embodiment the threshold frequency "A" may be about 10-50 Hz and may be moved to about 200-500 Hz as threshold frequency "C." Alternatively, the threshold frequency in "A" is about 10-20 Hz and is moved to about 200-300 Hz in "C."

The threshold frequency in position "A" may also depend on the number of adjustable ventilation openings and the gap distance a slot forms in the membrane. The threshold frequency in position "A" is higher for a MEMS structure with more adjustable ventilation openings (e.g. 32 adjustable ventilation openings) than for a MEMS structure with less adjustable ventilation openings (e.g., 2, 4 or 8 adjustable ventilation openings). The threshold frequency is also higher for MEMS structures with a larger slot gap (larger slot width and/or larger slot length) defining the adjustable ventilation opening than for those with a smaller slot gap.

Figure 3A:
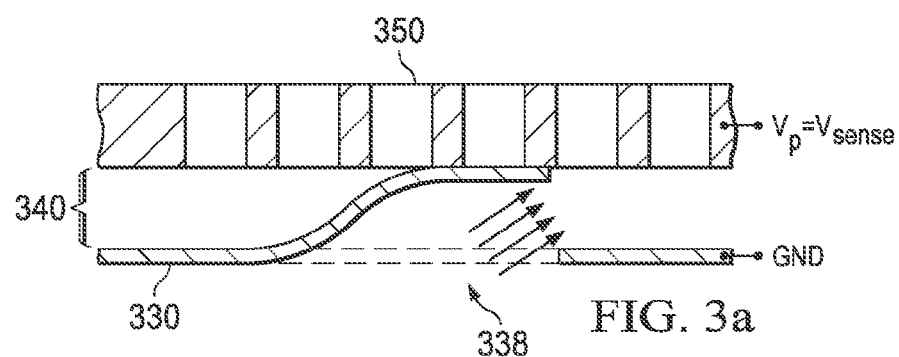
FIGS. 3a-3d show embodiments and configuration of an adjustable ventilation opening.

The embodiment of FIG. 3a shows a configuration of an actuation voltage (tuning or switching voltage) wherein the actuation voltage is identical to the sensing bias. The MEMS structure comprises a single electrode on the backplate 350, an air gap 340 and a membrane 330. The electrode of the backplate 350 is set to an actuation potential and the membrane 330 is set to ground. The adjustable ventilation opening 338 is closed with a low actuation voltage (OFF position) and open with a high actuation voltage (ON position). A low actuation voltage results in a low corner or threshold frequency and a low sensitivity of the MEMS structure, and a high actuation voltage results in a high corner or threshold frequency and a high sensitivity.

Figure 3B:
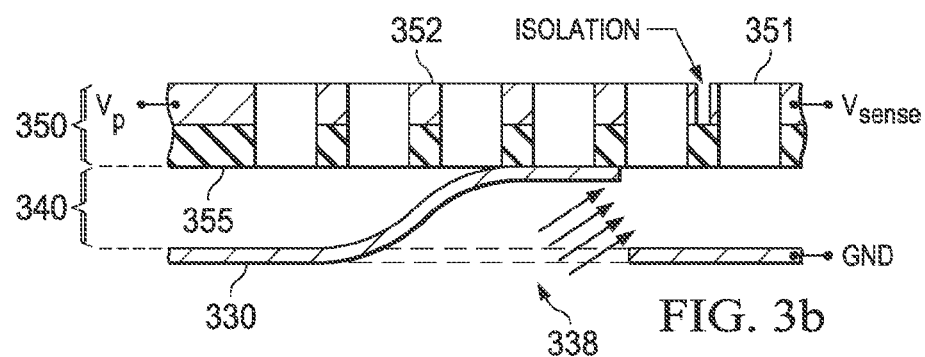

The embodiment of FIG. 3b shows a configuration wherein the actuation voltage (tuning or switching voltage) is independent from the sensing bias. The MEMS structure comprises a structured backplate 350, e.g., a backplate that has at least two electrodes, an air gap 340 and a membrane 330. The second electrode 352 of the backplate 350 is set to an actuation potential and the first electrode 351 is set to a sense potential. The membrane 320 is set to ground. The two electrodes are isolated from each other. For example, the backplate 350 may comprise the structured electrode and an isolation support 355. The isolation support 355 may face toward the membrane 320 or may face away from the membrane 320. The tuning or switching voltage does not influence the sensitivity of the MEMS structure.

The adjustable ventilation opening is 338 closed with a low actuation voltage (OFF position) and open with a high actuation voltage (ON position). A low actuation voltage results in a low corner or threshold frequency and a high actuation voltage results in a high corner or threshold frequency. The sense bias is independent from the actuation voltage and can be kept constant or independently decreased or increased.

Figure 3C:
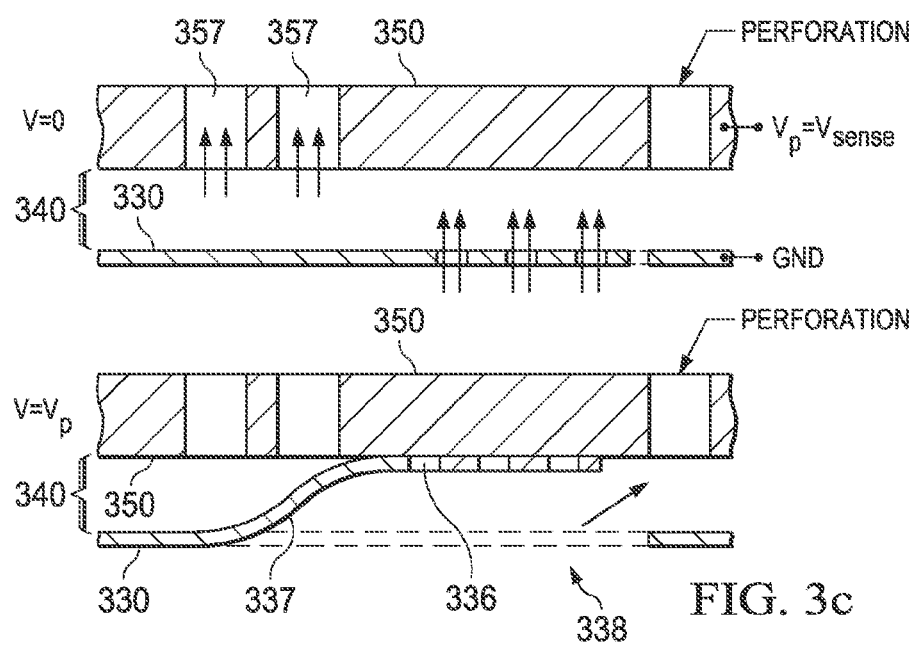

The embodiment of FIG. 3c shows a configuration of an actuation voltage (tuning or switching voltage) wherein the actuation voltage is identical to the sensing bias. The MEMS structure comprises a single electrode in the backplate 350, an air gap 340 and a membrane 330. The adjustable ventilation opening 338 is closed with a high actuation voltage (ON position) and is open with a low actuation voltage (OFF position). The movable portion 337 of the adjustable ventilation opening 338 touches the backplate 350 when activated and is in plane with the rest of the membrane when not activated. A low actuation voltage results in a high corner or threshold frequency and a low sensitivity of the MEMS structure, and a high actuation voltage results in low corner or threshold frequency and a high sensitivity of the MEMS structure. The backplate 350 comprises ventilation openings 357 and the movable portion 337 of the adjustable ventilation opening 338 comprises ventilation openings 336. The ventilation openings 336 in the movable portion 337 of the adjustable ventilation opening 338 are closed in an ON (or activated) position. There is no ventilation path through the adjustable ventilation opening 338 when the adjustable ventilation opening is in the ON (or activated) position.

Figure 3D:
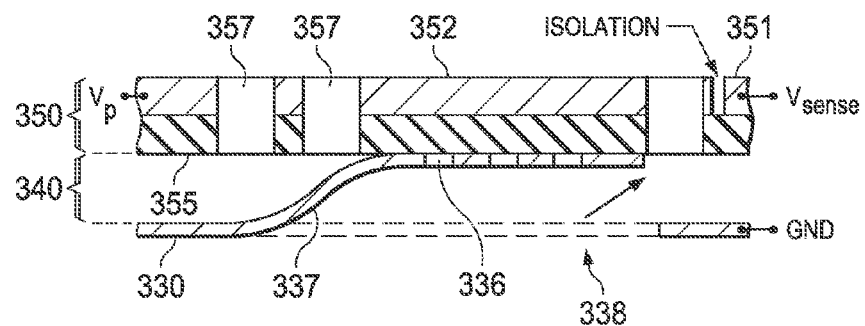

The embodiment of FIG. 3d shows the actuation voltage (tuning or switching voltage) wherein the actuation voltage is independent from the sensing bias. This MEMS structure comprises a structured backplate 350, e.g., the backplate may comprise a first electrode 351 and a second electrode 352, an air gap 340 and a membrane 330. Alternatively, the structured backplate 350 may comprise more than two electrodes. The second electrode 352 of the backplate 350 is set to an actuation potential and the first electrode 351 is set to a sense potential. The membrane 330 is set to ground. The first electrode 351 and the second electrode 352 are isolated from each other. For example, the backplate 350 may comprise the structured electrode and an isolation support 355. The isolation support 355 may face toward the membrane 330 or may face away from the membrane 330. The tuning or switching voltage does not influence the sensitivity of the MEMS structure.

The adjustable ventilation opening is closed with a high actuation voltage (ON position) and is open with a low actuation voltage (OFF position). A low actuation voltage (OFF position) results in a high corner or threshold frequency and a low actuation voltage (ON position) results in a high corner or threshold frequency. The sense bias is independent from the actuation voltage and can be kept constant or independently decreased or increased.

The backplate 350 comprises ventilation openings 357 and the movable portion 337 of the adjustable ventilation opening 338 comprises also ventilation openings 336. The ventilation openings 336 in the adjustable ventilation opening 338 are closed in the ON position. There is no ventilation path through the ventilation openings 357 of the backplate 338 and the ventilation openings 336 of the adjustable ventilation opening 338 when the adjustable ventilation opening 338 is open. There is no ventilation path through the ventilation openings 357 of the backplate 338 and the ventilation openings 336 of the adjustable ventilation opening 338 when the adjustable ventilation opening 338 is closed or in an OFF position.

Figure 4A:
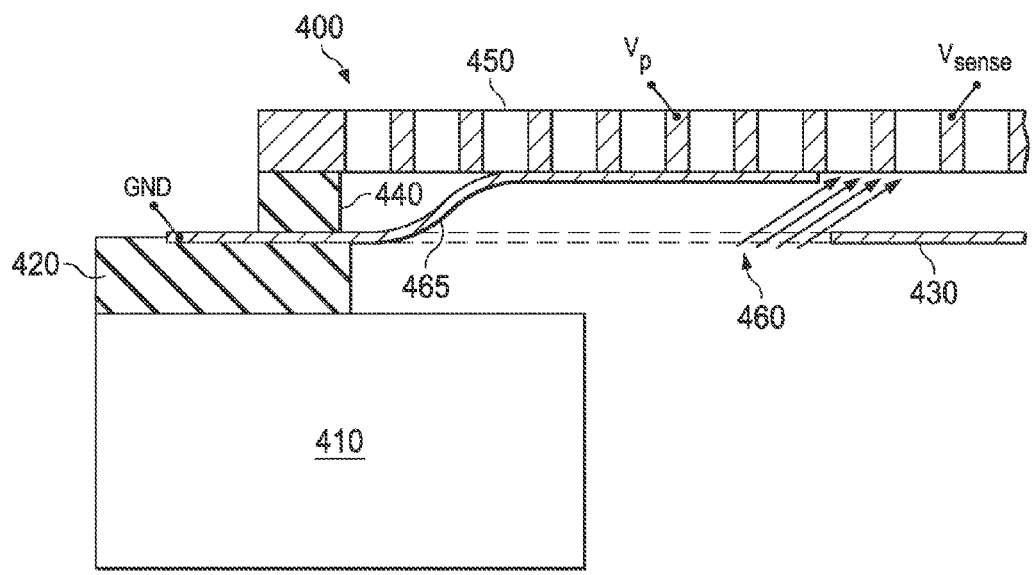
FIG. 4a shows a cross-sectional view of an embodiment of a MEMS structure, wherein the membrane is pulled toward the backplate.

The embodiment of FIG. 4a shows a cross-sectional view of a MEMS structure 400. The MEMS structure comprises a substrate 410. The substrate 410 comprises silicon or other semiconductor materials. Alternatively, the substrate 410 comprises compound semiconductors such as GaAs, InP, Si/Ge, or SiC, as examples. The substrate 410 may comprise single crystal silicon, amorphous silicon or polycrystalline silicon (polysilicon). The substrate 410 may include active components such as transistors, diodes, capacitors, amplifiers, filters or other electrical devices, or an integrated circuit. The MEMS structure 400 may be a stand-alone device or may be integrated with and IC into a single chip.

The MEMS structure 400 further comprises a first insulating layer or spacer 420 disposed over the substrate 410. The insulating layer 420 may comprise an insulting material such a silicon dioxide, silicon nitride, or combinations thereof.

The MEMS structure 400 further comprises a membrane 430. The membrane 430 may be a circular membrane or a square membrane. Alternatively, the membrane 430 may comprise other geometrical forms. The membrane 430 may comprise conductive material such as polysilicon, doped polysilicon or a metal. The membrane 430 is disposed above the insulating layer 420. The membrane 430 is physically connected to the substrate 410 in a region close to the rim of the substrate 410.

Moreover, the MEMS structure 400 comprises a second insulating layer or spacer 440 disposed over a portion of the membrane 430. The second insulating layer 440 may comprise an insulting material such as a silicon dioxide, silicon nitride, or combinations thereof.

A backplate 450 is arranged over the second insulating layer or spacer 440. The backplate 450 may comprise a conductive material such as polysilicon, doped polysilicon or a metal, e.g., aluminum. Moreover, the backplate 450 may comprise an insulating support or insulating layer regions. The insulating support may be arranged toward or away from the membrane 430. The insulating layer material may be silicon oxide, silicon nitride or combinations thereof. The backplate 450 may be perforated.

The membrane 430 may comprise at least one adjustable ventilation opening 460 as described above. The adjustable ventilation openings 460 may comprise a movable portion 465. In one embodiment the adjustable ventilation openings 460 are located in a region close to the rim of the substrate 410. For example, the adjustable ventilation openings 460 may be located in the outer 20% of the radius of the membrane 430 or the outer 20% of the distance from a center point to the membrane 430 edge of a square or a rectangle. In particular, the adjustable ventilation openings 460 may not be located in a center region of the membrane 430. For example, the adjustable ventilation openings 460 may not be located in the inner 80% of the radius or the distance. The adjustable ventilation openings 460 may be located in equidistant distances from each other along a periphery of the membrane 430.

The embodiment of FIG. 4a is configured so that the adjustable ventilation openings 460 open toward the backplate 450. The membrane 430 and the backplate 450 may have any of the configurations as described in FIGS. 2a-2d and 3a-3d. The backplate 450 is set to a sense voltage $V_{sense}$ and an actuation voltage $V_p$ (sense voltage and actuation voltage can be the same or different as described above) and the membrane 430 is set to ground, or vice versa.

Figure 4B:
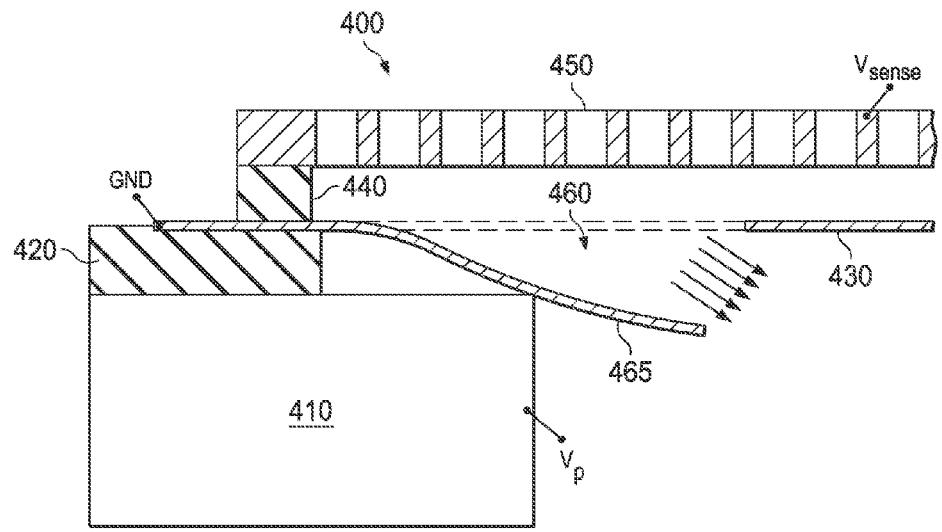
FIG. 4b shows a cross-sectional view of an embodiment of a MEMS structure, wherein the membrane is pulled toward the substrate.

The MEMS structure 400 of the embodiment of FIG. 4b shows a similar structure to that of the embodiment in FIG. 4a. However, the configuration is different, e.g., the movable portion 465 of the adjustable ventilation opening 460 is pulled toward the substrate 410. The backplate is set to a sense voltage $V_{sense}$, the substrate is set to the actuation voltage $V_p$ and the membrane is set to ground. In this configuration of the MEMS structure 400 the actuation voltage (tuning or switching voltage) is independent of the sensing voltage.

Figure 5A:
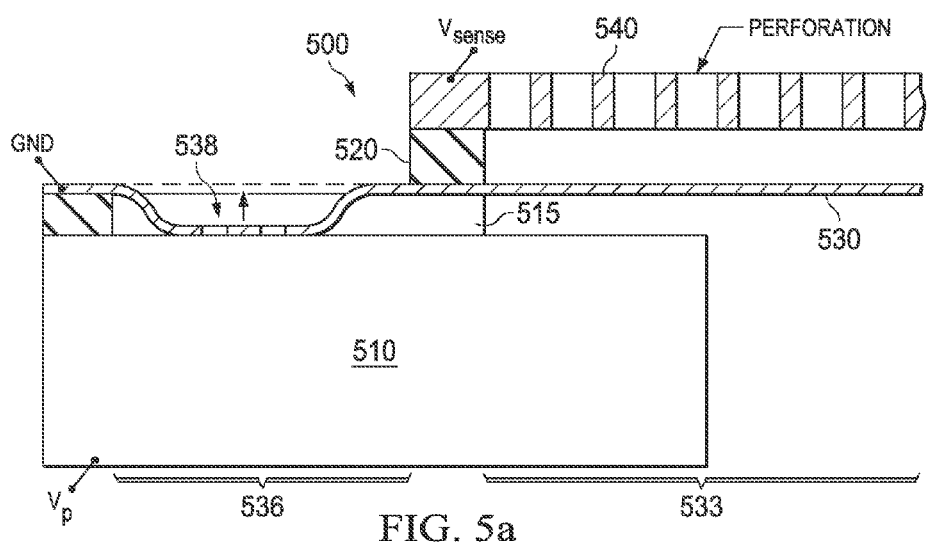
FIG. 5a shows a cross-section view of an embodiment of a MEMS structure.
Figure 5B:
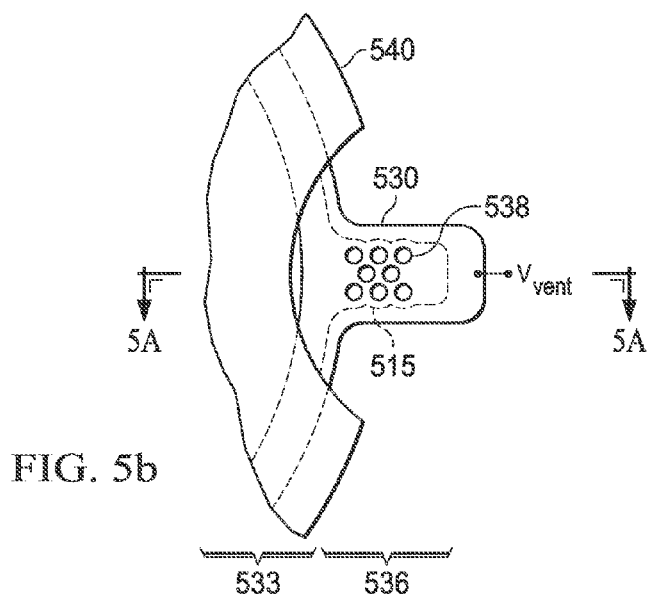

The embodiment of FIG. 5a shows a cross sectional view and FIG. 5c shows a top view of a MEMS structure 500 having a membrane 530 extending over a portion of the substrate 510 and outside a sensing region 533. The MEMS structure 500 comprises a substrate 510, a connection region 520, a membrane 530 and a backplate 540 which comprise similar materials as described with respect to the embodiment in FIG. 4a. The membrane 530 comprises a sensing region 533 and a tuning region 536. The sensing region 533 is located between the opposite rims of the substrate 510 or between the opposite connection regions 520. The tuning region 533 extends over a portion of the substrate 510 and is located outside the sensing region 533. The sensing region 536 may be located on a first side of the connection region 520 and the tuning region 533 may be located on a second side of the connection region 520. A recess 515 (under etch) is formed between the membrane 530 and the substrate 510 in the tuning region 536. The backplate 540 overlies only the sensing region 533 but not the tuning region 536 of the membrane 530. The backplate 540 may be perforated. The backplate 540 is set to a bias voltage $V_{sense}$, the substrate 510 is set to a tuning voltage $V_p$ and the membrane is set to ground. In this configuration of the MEMS structure 500 the tuning voltage is independent of the sensing voltage.

The tuning region 536 of the membrane 530 comprises at least one adjustable ventilation openings 538 which provide a ventilation path in a non-actuated position (OFF position) and which does not provide a ventilation path in an actuated position (ON positioni). The non-actuated or open position (OFF position) is a position wherein the adjustable ventilation openings 538 are in the same plane as the membrane 530 in the sensing region 533 in in its resting position. The actuated or closed position (ON position) is a position wherein the adjustable ventilation openings 538 are pressed against the substrate 510 and the ventilation path is blocked. Intermediate positions may be set by pulling the adjustable ventilation openings 538 towards the substrate 510 but where the adjustable ventilation openings 538 are not pressed against the substrate 510. It is noted that the sensing region 533 may or may not comprise adjustable ventilation openings 538.

Figure 6A:
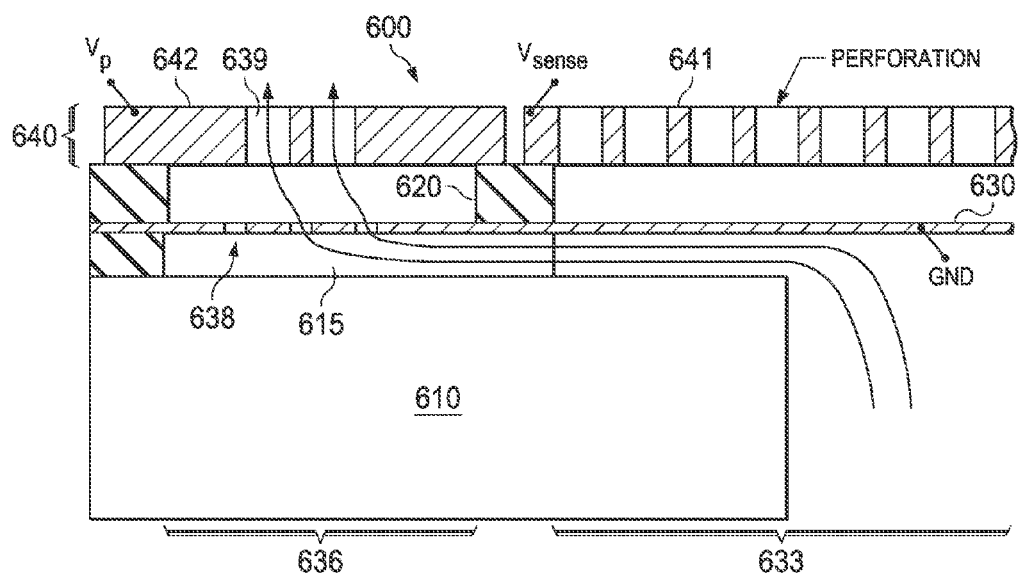
FIG. 6a shows a cross-section view of an embodiment of a none actuated MEMS structure.
Figure 6B:
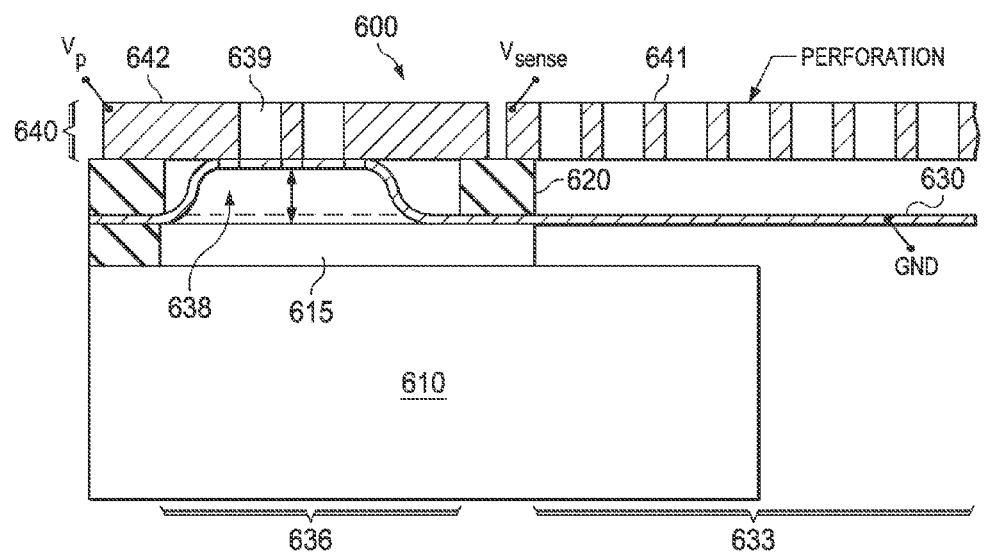
FIG. 6b shows a cross-section view of an embodiment of an actuated MEMS structure.

The embodiment of FIGS. 6a and 6b show a cross sectional view of a MEMS structure 600 having a membrane 630 extending over a portion of the substrate 610 outside a sensing region 633. The MEMS structure 600 comprises a substrate 610, a connection region 620, a membrane 630 and a backplate 640 which comprise similar materials as described with respect to the embodiment in FIG. 4a. The membrane 630 comprises a sensing region 633 and a tuning region 636. The sensing region 633 is located between the opposite rims of the substrate 610 or between the opposite connection regions 620. The tuning region 636 extends over a portion of the substrate 610 and is located outside the sensing region 633. The sensing region 633 may be located on a first side of the connection region 620 and the tuning region 636 may be located on a second side of the connection region 620. A recess 615 is formed between the membrane 630 and the substrate 610 in the tuning region 636. The backplate 640 overlies the sensing region 633 and the tuning region 636 of the membrane 630. The backplate 640 may be perforated in the sensing region 633 and the tuning region. Alternatively, the backplate 640 may be perforated in the sensing region 633 but not in the tuning region 636. The backplate 640 comprises a first electrode 641 and a second electrode 642. Alternatively, the backplate 640 comprise more than two electrodes. The first electrode 641 is isolated from the second electrode 642. The first electrode 641 is disposed in the sensing region 633 and the second electrode 642 is disposed in the tuning region 636. The first electrode 641 is set to a bias voltage $V_{sense}$, and the second electrode 642 is set to the tuning voltage $V_p$. The membrane 630 is set to ground. In this configuration of the MEMS structure 600 the tuning voltage is independent of the sensing voltage.

The tuning region 636 of the membrane 630 comprises one or more adjustable ventilation openings 638 which provide a ventilation path in an non-actuated position (OFF position) in FIG. 6a and which does not provide a ventilation path in an actuated position (ON position) in FIG. 6b. The open position or non-actuated (OFF position) is a position wherein the adjustable ventilation openings 638 are in the same plane as the membrane 630 in the sensing region 633 in its resting position. The closed position or actuated position (ON position) is a position wherein the adjustable ventilation openings 638 are pressed against the backplate 640 and the ventilation path is blocked. The MEMS structure 600 provides a ventilation path and a high corner frequency when it is not in an actuated position (OFF position). The MEMS structured 600 provides a closed ventilation path and a low corner frequency when it is in an actuated position (ON position). Intermediate positions may be set by pulling the adjustable ventilation openings 638 toward the backplate 640 but where the adjustable ventilation openings 638 are not pressed against the backplate 640. It is noted that the sensing region 633 may or may not comprise adjustable ventilation openings 638.

The backplate 640 comprises ventilation openings 639 and the membrane 630 comprises adjustable ventilation openings 638 in the tuning region 636. In one embodiment the ventilation openings 639 and the adjustable ventilation openings 638 are reversely aligned with respect to each other.

Figure 7A:
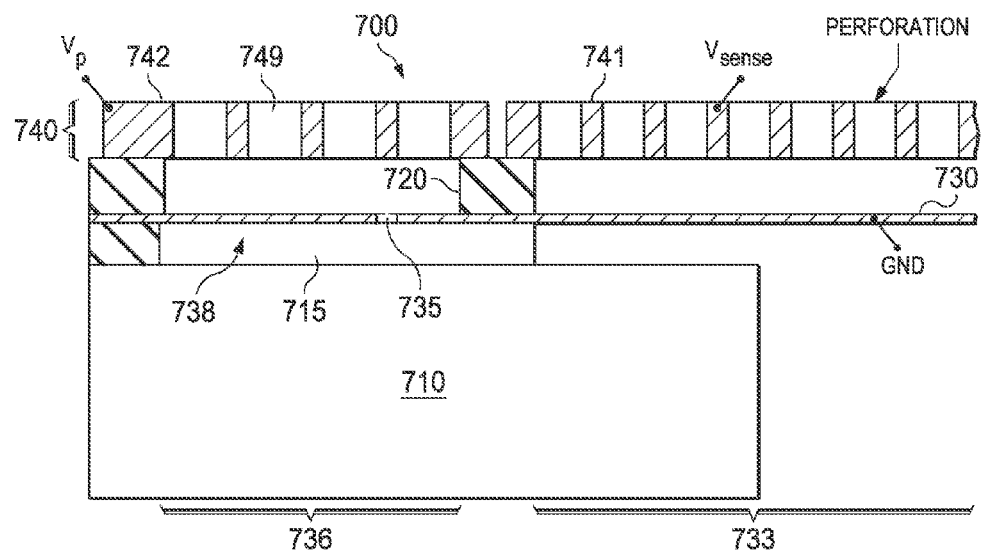
FIG. 7a shows a cross-section view of an embodiment of a none actuated MEMS structure.

The embodiment of FIGS. 7a and 7b show a cross sectional view and FIG. 7c shows a top view of a MEMS structure 700 having a membrane 730 extending over a portion of the substrate 710 and outside a sensing region 733. The MEMS structure 700 comprises a substrate 710, a connection region 720, a membrane 730 and a backplate 740 which comprise similar materials as described with respect to embodiment of FIG. 4a. The backplate 740 may comprise a sensing backplate (e.g. circular or rectangle) 741 and a backplate bridge 742.

The membrane 730 comprises a sensing region 733 and a tuning region 736. The sensing region 733 is located between the opposite rims of the substrate 710 or between the opposite connection regions 720. The tuning region 733 extends over a portion of the substrate 710 and is located outside the sensing region 733. The sensing region 736 may be located on a first side of the connection region 720 and the tuning region 733 may be located on a second side of the connection region 720. A recess 715 (under etch) is formed between the membrane 730 and the substrate 710 in the tuning region 736. The membrane 730 comprises an adjustable ventilation opening 738 formed by a slot 735. The slot 735 forms a movable portion as described in FIGS. 2a-2c for the adjustable ventilation opening 738

The backplate 740 overlies the sensing region 733 and the tuning region 736 of the membrane 730. For example, the sensing backplate 741 (first electrode) overlies the sensing region 733 and the backplate bridge 742 (second electrode) overlies the tuning region 736. Alternatively, the backplate 740 comprise more than two electrodes. The first electrode 741 is isolated from the second electrode 742. The first electrode 741 is set to a bias voltage $V_{sense}$ and second electrode 742 is set to a tuning voltage $V_p$. The membrane 730 is set to ground. In this configuration of the MEMS structure 700 the tuning voltage is independent of the sensing voltage. The backplate 740 may be perforated in the sensing region 733 and the tuning region 736. Alternatively, the backplate 740 may be perforated in the sensing region 733 but not in the tuning region 736. The backplate bridge 742 comprises ventilation openings 749.

The tuning region 736 of the membrane 730 comprises one or more adjustable ventilation openings 738 which provide a ventilation path in an actuated position (ON position) in FIG. 7b and which do not provide a ventilation path in a non-actuated position (OFF position) in FIG. 7a. The closed or non-actuated position (OFF position) is a position wherein the adjustable ventilation openings 738 are in the same plane as the membrane 730 in the sensing region 733 in its resting position. The open or actuated position (ON position) is a position wherein the adjustable ventilation openings 738 are pressed against the backplate 740 and the ventilation path is open. The MEMS structure 700 provides a ventilation path and a high corner frequency when it is in an actuated position (ON position). The MEMS structured 700 provides a closed ventilation path and a low corner frequency when it is in none actuated position (OFF position). Intermediate positions may be set by pulling the adjustable ventilation openings 738 toward the backplate 740 but where the adjustable ventilation openings 738 are not pressed against the backplate 740. It is noted that the sensing region 733 may or may not comprise adjustable ventilation openings 738.

Figures 8A, 8B:
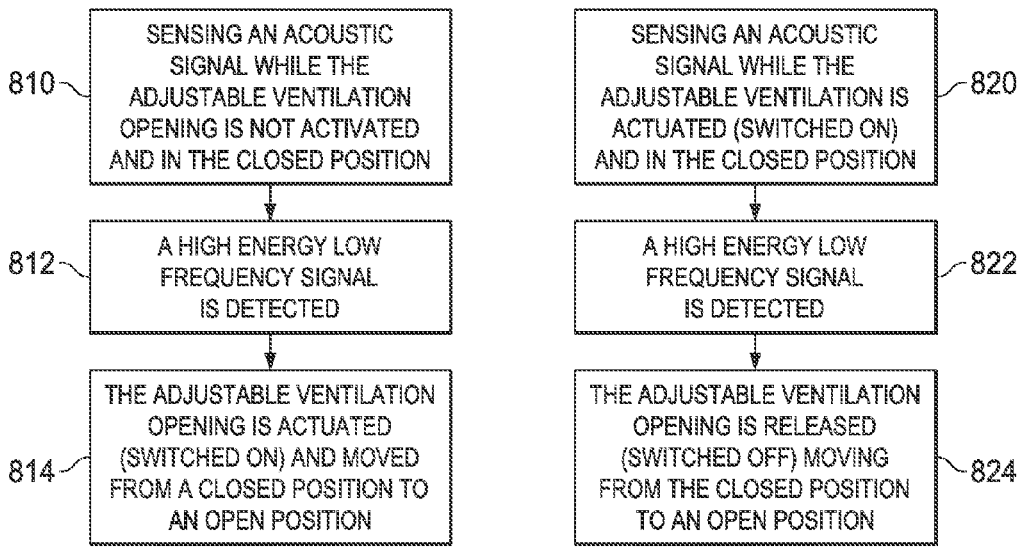
FIG. 8a shows a flow chart of an operation of a MEMS structure, wherein the adjustable ventilation opening is originally closed.
FIG. 8b shows a flow chart of an operation of a MEMS structure, wherein the adjustable ventilation opening is originally open.

FIG. 8a shows an embodiment of operating a MEMS structure. In a first step 810, an acoustic signal is sensed by moving a membrane relative to a backplate. The adjustable ventilation opening is in a closed position. In a next step 812, a high energy signal is detected. The adjustable ventilation opening is moved from a closed position to an open position, 814. The open position may be a completely open position or a partially open position.

FIG. 8b shows an embodiment of operating a MEMS structure. In a first step, 820, an acoustic signal is sensed by moving a membrane relative to a backplate. The adjustable ventilation opening is in an open position. In a next step 822, a high energy signal is detected. The adjustable ventilation opening is moved from the open position to a closed position, 824. The closed position may be a completely closed position or a partially closed position.

Figures 8C, 8D:
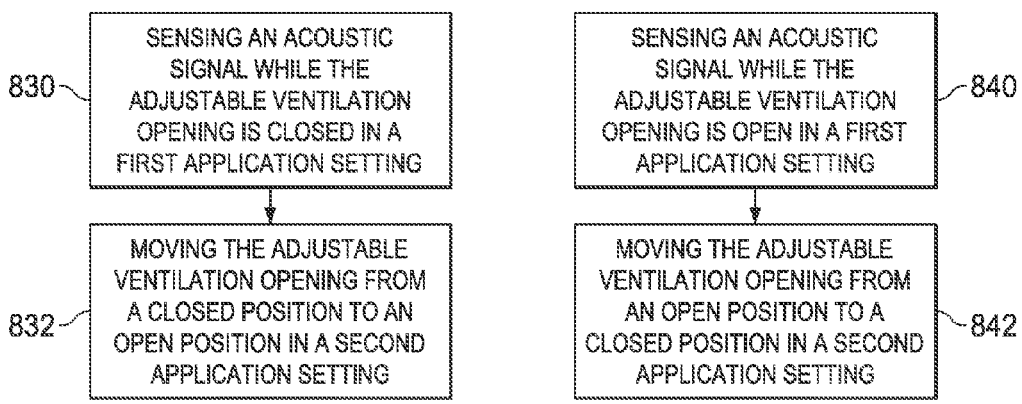
FIG. 8c shows a flow chart of an operation of a MEMS structure, wherein the adjustable ventilation opening is opened to switch from a first application setting to a second application setting.
FIG. 8d shows a flow chart of an operation of a MEMS structure, wherein the adjustable ventilation opening is closed to switch from a first application setting to a second application setting.

FIG. 8c shows an embodiment of operating a MEMS structure. In a first step, 830, the MEMS structure is in a first application setting sensing acoustic signals by moving a membrane relative to a backplate. The adjustable ventilation opening is in a closed position. In a second step, 832, the MEMS structure is in a second application setting sensing acoustic signals by moving a membrane relative to the backplate. The adjustable ventilation opening is moved from a closed position to an open position. The open position may be a completely open position or a partially open position.

FIG. 8d shows an embodiment of operating a MEMS structure. In a first step, 840, the MEMS structure is in a first application setting sensing acoustic signals by moving a membrane relative to a backplate. The adjustable ventilation opening is in an open position. In a second step, 842, the MEMS structure is in a second application setting sensing acoustic signals by moving a membrane relative to the backplate. The adjustable ventilation opening is moved from an open position to an closed position. The closed position may be a completely closed position or a partially closed position.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A MEMS structure comprising:
a substrate;
a backplate; and
a membrane comprising an adjustable ventilation opening,
wherein the backplate and the membrane are mechanically connected to the substrate,
wherein the adjustable ventilation opening is formed in the membrane by a movable portion of the membrane, and
wherein the movable portion of the membrane is displaceable out of the membrane.

2. The MEMS structure according to claim 1, wherein the membrane comprises a central region and an outer region, the out region encompassing the central region, and wherein the adjustable ventilation opening is located in the outer region.

3. The MEMS structure according to claim 1, wherein the backplate is a structured backplate having a first electrode and a second electrode, and wherein the adjustable ventilation opening corresponds to the second electrode but not to the first electrode.

4. The MEMS structure according to claim 1, wherein the adjustable ventilation opening is configured to move toward the substrate if actuated.

5. The MEMS structure according to claim 1, wherein the adjustable ventilation opening is configured to move toward the backplate if actuated.

6. The MEMS structure according to claim 1, wherein the adjustable ventilation opening comprises a cantilever, and wherein the cantilever is without ventilation openings.

7. The MEMS structure according to claim 1, wherein the adjustable ventilation opening comprises a cantilever, and wherein the cantilever comprises ventilation openings.

8. The MEMS structure according to claim 1, wherein the adjustable ventilation opening comprises a plurality of adjustable ventilation openings, and wherein the adjustable ventilation openings are disposed in a periphery of the membrane placed in equidistant distances.

9. A method for operating a MEMS structure, the method comprising:
   sensing an acoustic signal by moving a sensing region of a membrane relative to a backplate; and
   opening or closing an adjustable ventilation opening in the membrane if a low frequency high energy signal is detected, wherein the adjustable ventilation opening is formed in the membrane by a movable portion of the membrane, and wherein the movable portion of the membrane is displaceable out of the membrane.

10. The method according to claim 9, wherein the adjustable ventilation opening is located in a periphery region of the membrane.

11. The method according to claim 9, wherein the adjustable ventilation opening is located in a tuning region of the membrane, and wherein the tuning region of the membrane is located outside the sensing region of the membrane.

12. A method for operating a MEMS structure, the method comprising:
   sensing an acoustic signal by moving a membrane relative to a backplate; and
   opening or closing an adjustable ventilation opening in the membrane if an application setting of the MEMS structure is changed, wherein the adjustable ventilation opening is formed in the membrane by a movable portion of the membrane, and wherein the movable portion of the membrane is displaceable out of the membrane.

13. The method according to claim 12, wherein the adjustable ventilation opening is located in a periphery region of the membrane.

* * * * *